(12) United States Patent
Tukker et al.

(10) Patent No.: US 9,377,179 B2
(45) Date of Patent: Jun. 28, 2016

(54) COLOR CORRECTING OPTICAL ELEMENT

(71) Applicant: KONINKLIJKE PHILIPS N.V., Eindhoven (NL)

(72) Inventors: Teunis Willem Tukker, Eindhoven (NL); Willem Lubertus Ijzerman, Oss (NL); Cornelia Roline Prins, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/395,073

(22) PCT Filed: Apr. 16, 2013

(86) PCT No.: PCT/IB2013/053016
§ 371 (c)(1),
(2) Date: Oct. 17, 2014

(87) PCT Pub. No.: WO2013/160802
PCT Pub. Date: Oct. 31, 2013

(65) Prior Publication Data
US 2015/0109789 A1     Apr. 23, 2015

Related U.S. Application Data

(60) Provisional application No. 61/637,925, filed on Apr. 25, 2012.

(51) Int. Cl.
*F21V 3/00* (2015.01)
*F21V 5/00* (2015.01)
*F21V 13/04* (2006.01)
(Continued)

(52) U.S. Cl.
CPC . *F21V 13/04* (2013.01); *F21K 9/56* (2013.01); *F21V 5/04* (2013.01); *F21V 5/045* (2013.01);
(Continued)

(58) Field of Classification Search
CPC ............. F21K 9/56; F21K 5/04; F21K 5/045; F21K 5/048; F21K 13/04; F21K 13/14; G02B 19/0028; G02B 19/0061
USPC ............ 362/230–231, 244–245, 249.02, 293, 362/299–300, 307–309, 311.01–311.02, 362/326–327
See application file for complete search history.

(56) References Cited

U.S. PATENT DOCUMENTS 7,597,459 B2   10/2009   Maeda et al.
7,731,388 B2    6/2010   Hoelen et al.
(Continued)

FOREIGN PATENT DOCUMENTS

EP      2180232 A1      4/2010
JP      2011150790 A  * 8/2011
WO      2004084316 A2   9/2004

OTHER PUBLICATIONS

Maes, "Mathematical Methods for Reflector Design", Thesis, 1997, ISBN 90-74445-36-5, pp. 1-174.

*Primary Examiner* — Jason Moon Han

(57) ABSTRACT

A circular symmetric optical element for redirecting light which is emitted by a light source through a wavelength converting element, wherein the emitted light have an average color $c_A$ and a wavelength distribution depending on an emission angle from the wavelength converting element. Light having the average color $c_A$ have an emission angle $t_A$. The optical element comprises: a first optical portion configured to receive and redirect light having emission angles from the wavelength converting element lower than tA, and a second optical portion configured to receive and redirect light having emission angles from the wavelength converting element higher than $t_A$, wherein the first and second optical portions are individually configured such that for light of each selected out-coupling angle of the optical element, there is light received and redirected by the first optical portion to the selected out-coupling angle of the optical element, and corresponding light received and redirected by the second optical portion to the selected out-coupling angle from the optical element such that the total light beam emitted from the optical element as seen in the far field have a homogeneous color.

11 Claims, 2 Drawing Sheets

(51) Int. Cl.
*G02B 19/00* (2006.01)
*F21K 99/00* (2016.01)
*F21V 5/04* (2006.01)
*F21V 13/14* (2006.01)
*H01L 33/58* (2010.01)

(52) U.S. Cl.
CPC ............ *F21V 13/14* (2013.01); *G02B 19/0028* (2013.01); *G02B 19/0061* (2013.01); *H01L 33/58* (2013.01)

(56) References Cited

U.S. PATENT DOCUMENTS

| | | | |
|---|---|---|---|
| 7,985,015 | B2 | 7/2011 | Tasch et al. |
| 8,981,402 | B2* | 3/2015 | Shinohara ................ F21V 5/04 257/100 |
| 2007/0114551 | A1 | 5/2007 | Kawaguchi et al. |
| 2009/0128921 | A1 | 5/2009 | Roth |
| 2010/0110695 | A1 | 5/2010 | Nakamura |

* cited by examiner

COLOR CORRECTING OPTICAL ELEMENT

CROSS-REFERENCE TO PRIOR APPLICATIONS

This application is the U.S. National Phase application under 35 U.S.C. §371 of International Application No. PCT/IB2013/053016, filed on Apr. 16, 2013, which claims the benefit of U.S. Provisional Patent Application No. 61/637,925, filed on Apr. 25, 2012. These applications are hereby incorporated by reference herein.

FIELD OF THE INVENTION

The present invention relates to an optical element. In particular, the present invention relates to an optical element for redirecting light emitted from a wavelength converting element.

BACKGROUND OF THE INVENTION

Lighting systems using light emitting diodes (LEDs) for providing white light is at the point of surpassing conventional lighting technologies such as fluorescent lamps with regard to light output, light quality and efficiency.

However, it is difficult to produce an LED which emits white light with a uniform color at a desirable color temperature. Therefore, various types of wavelength converting elements are often used to convert light emitted by LEDs. As an example, LEDs emitting light in the blue region of the spectra are often combined with a yellow phosphor material for achieving white light. Light from the LED entering the phosphor undergoes wavelength conversion, and the degree of conversion is related to the distance which the light travels through the phosphor. Accordingly, the wavelength of the light emitted from the phosphor element depends on the distance between the light source and the light emission surface of the phosphor element. Thus, assuming a phosphor element having a flat light emission surface, the color output is angle dependent.

An angle dependent color output will lead to that light emitted from the surface of a phosphor element at an angle close to the normal of the surface is closer to the blue end of the spectra compared to the more yellowish light emitted essentially parallel to the surface. This color variation phenomenon is known as Color-over-Angle (CoA) variation. CoA variation is undesirable as it produces a ring-like effect in the light-output from the phosphor element where a yellowish ring may be seen around the edges of the preferably white light beam.

Several different approaches for CoA correction have been tried in order to overcome the above effect, such as by grading the phosphor layer or using dichroic filters. However, these methods may reduce the efficiency and increase the complexity, and thereby the manufacturing costs of a lighting system. Another proposed solution is to introduce microstructures on top of a collimating structure.

SUMMARY OF THE INVENTION

In view of the above-mentioned and other drawbacks of the prior art, it is an object of the present invention to provide an improved optical element for Color-over-Angle correction.

According to an aspect of the invention, this and other objects are achieved by a circular symmetric optical element for redirecting light, the light being emitted by a light source through a wavelength converting element, wherein the light emitted from the wavelength converting element have an average color $c_A$ and a wavelength distribution depending on an emission angle from the wavelength converting element, wherein light having the average color $c_A$ have an emission angle $t_A$, the optical element comprising: a first optical portion configured to receive and redirect light having emission angles from the wavelength converting element lower than $t_A$, and a second optical portion configured to receive and redirect light having emission angles from the wavelength converting element higher than $t_A$, wherein the first and second optical portions are individually configured such that for light of each selected out-coupling angle of the optical element, there is light received and redirected by the first optical portion to the selected out-coupling angle of the optical element, and corresponding light received and redirected by the second optical portion to the selected out-coupling angle from the optical element such that the total light beam emitted from the optical element as seen in the far field have a homogeneous color.

The present invention is based on the realization that improved CoA correction may be achieved by an optical element which combines light having wavelengths shorter than the average color with light having wavelengths longer than the average color in such a way that light emitted from the optical element as seen in the far field have a homogeneous color. Such an optical element may be achieved by calculating the shapes of the first and second portions of the optical element based on the wavelength distribution and flux distribution of light emitted from the wavelength converting element. Accordingly, an optical element providing improved CoA correction may be achieved for an arbitrary light source and wavelength converting element combination exhibiting CoA variation.

The optical element is circular symmetric, meaning that it exhibits rotational symmetry around a central axis. Furthermore, the optical element is preferably arranged in relation to the wavelength converting element so that the central axis is aligned with the center of the wavelength converting element, which is also assumed to be circular symmetric. However, the wavelength converting element may have an arbitrary shape, as long as the wavelength distribution and flux distribution of light emitted from the element is essentially circular symmetric. The wavelength converting element may be formed by a single layer or by a stack or mixture of phosphor or luminescent ceramics, and the light source may for example be a blue light emitting diode (LED). However, the general inventive concept is equally applicable for other types of light sources, such as for example UV-diodes. The resulting effect of a yellow phosphor wavelength converting material is to convert light emitted by the LED at the blue end of the spectra into light having wavelengths in the yellow region. As the degree of wavelength conversion is proportional to the length which light travels in the wavelength converting element, emitted light has a wavelength distribution proportional to the emission angle from the element.

The optical element is described for a combination of a light source and a wavelength converting element having a wavelength distribution described by a linear color vs. angle relation in the CIE1931 XY color space.

In relation to the invention, light emitted perpendicular to the surface, i.e. in the direction of the normal, of the wavelength converting element is defined as having the angle 0° and light emitted parallel to the surface of the wavelength converting element is defined as having the angle 90°. Accordingly, assuming a linear relationship between emission angle and wavelength, the color vs. angle relation may be described by a straight line between the color point for light emitted at 0° and the color point for light emitted at 90° in an xy color space, where light emitted at 0° is closer to the blue end of the spectra and light emitted at 90° is closer to the yellow region of the spectra. The average color of light emitted from the wavelength converting element, $c_A$, is determined by the wavelength distribution and the flux distribution of the emitted light. Thereby, as the color point $c_A$ is located on the abovementioned straight line between 0° and 90°, the angle $t_A$ corresponding to the angle at which the average color is emitted can be found.

Furthermore, the homogeneous color may preferably correspond to the average color $c_A$. Provided that essentially all light emitted from the wavelength converting element is outcoupled in a desired emission direction by the optical element and that losses are negligible, the color seen in the far field will correspond to the average color $c_A$. However, a color output differing from $c_A$ may be achieved for example by blocking certain wavelengths or wavelength ranges in the optical element.

Moreover, the intersection between the first and second portion may be determined by $t_A$. Assuming that the bottom portion of the optical element is arranged in the same plane as the wavelength converting element, and that the central axis of the optical element is aligned with the central axis of the wavelength converting element, the intersection between the first and second portions of the optical element is defined by the angle $t_A$, such that light emitted at angles lower than $t_A$ are directly received by the first portion of the optical element and light emitted at angles larger than $t_A$ are directly received by the second portion of the optical element.

According to one embodiment of the invention, the first optical portion may advantageously have a curved surface for receiving and refracting light emitted from the wavelength converting element towards a light-output surface of the optical element.

Furthermore, the first optical portion may be a plano-convex lens. By providing the surface receiving light having angles lower than $t_A$ in the form of the curved surface of a plano-convex lens, light reaching the first portion is refracted towards the normal of the emission surface of the optical element.

In one embodiment of the invention, the second optical portion may advantageously have a first surface for receiving and refracting light emitted from the wavelength converting element; and a second curved surface for receiving and reflecting said light refracted at the flat surface towards a light-output surface of the optical element.

As outlined above, the curvatures of the first and second portion are theoretically determined based on a wavelength and flux distribution from the wavelength converting element in order to provide light emitted from the optical element having a homogeneous color in the far field, as will be further discussed below in the detailed description.

Moreover, in various embodiments, the first surface for receiving and refracting light may either be a flat surface or a curved surface. Depending on if the first surface is selected as a flat surface or as a curved surface, the corresponding second curved surface of the second portion will have to be designed accordingly.

According to one embodiment, the second curved surface of the second optical portion may be divided into two segments having different curvature. In some cases, the color vs. angle relation is described by a non-linear function. As an example, if the color vs. angle relation is a parabolic function, the same effect as described above of a homogeneous light output may be achieved by dividing the second curved surface of the second optical portion into two segments having different curvature. Accordingly, the described function of the optical element may in principal be achieved for an arbitrary color vs. angle relation.

In one embodiment of the invention, the light emitted from the optical element may advantageously have a Gaussian intensity profile.

The optical element may for example be provided as a component in a luminaire further comprising: a light source; a wavelength converting element arranged so that light emitted by the light source pass through the wavelength converting element and further on through the optical element according to the above description.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

This and other aspects of the present invention will now be described in more detail, with reference to the appended drawings showing embodiments of the invention.

DETAILED DESCRIPTION

In the present detailed description, various embodiments of the optical element according to the present invention are mainly discussed with reference to a circular symmetric optical element in the form of a total internal reflection (TIR) collimator. It should be noted that this by no means limits the scope of the present invention which is equally applicable to an optical element in the form of a refracting or reflecting collimator.

Figure 1:
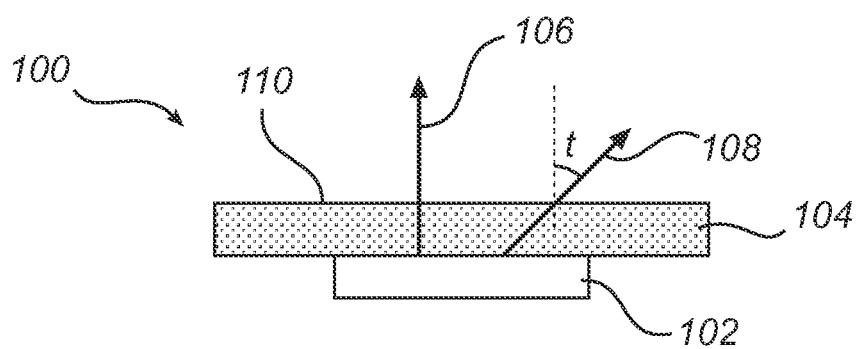
FIG. 1 is a schematic illustration of a light emitting device and a wavelength converting element.

FIG. 1 schematically illustrates the layout of a lighting element 100 comprising a light emitting diode (LED) chip 102 covered by a wavelength converting phosphor element 104. Two different ray paths, 106 and 108, are shown corresponding to light emitted from the surface of the phosphor element 104 at different angles. The angle is defined so that light emitted in a direction perpendicular to the surface 110 of the phosphor element is defined as 0°. Accordingly, light emitted parallel to the surface is defined as having an emission angle of 90°. An emission angle t is defined as the angle between the emitted light and the normal of the surface 110. A color over angle variation occurs as the optical path of light 106 through the phosphor element 104 in the direction perpendicular to the surface is shorter than paths of light 108 at higher angles.

Figure 2:
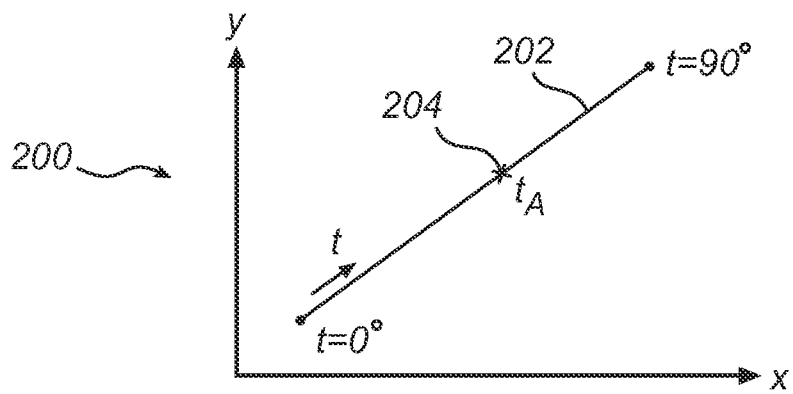
FIG. 2 is a graph schematically illustrating an example color vs. angle relation.

In FIG. 2, a graph 200 illustrating the x,y color point as a function of the emission angle t is drawn. For a given LED 102 and phosphor element 104 combination, measurements have shown that light emitted by the phosphor LED combination is a straight line 202 in the x,y color space. Here, the LED is a blue LED. At t=0° the light is bluish and at t=90° the light is yellowish, in other words at small angles the x and y coordinates are smaller than at high angles as illustrated in FIG. 2. The average color point of the LED, which may be measured in an integrating sphere, is indicated by the cross 204 on the line 202. Accordingly, there is an angle, defined as $t_A$, at which the color point of the light emitted by the LED is equal to the average color point of the LED. For a color over angle variation according FIG. 2, it is possible to collimate the light into one beam with a color point that is equal at all angles. The minimum requirement is that an optical element has to have at least two segments. The segments can be refractive (lens) or reflective (mirror) or a combination thereof.

Figure 3:
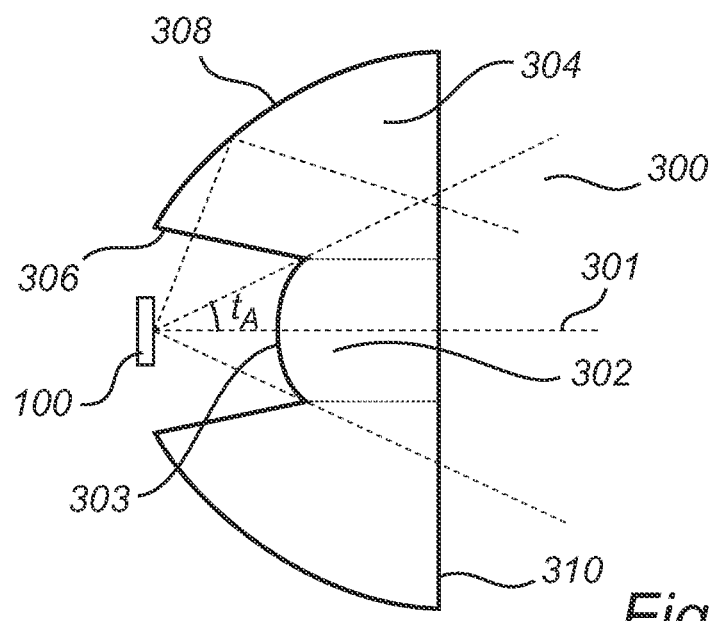
FIG. 3 is a schematic illustration of an optical element according to an embodiment of the invention.

FIG. 3 schematically illustrates a cross section of an example implementation of an optical element 300 according to the invention in the form of a circular symmetric TIR collimator. The collimator may for example be made from a transparent plastic material. The optical axis 301 is defined as the central axis of the optical element 300 which is arranged to be aligned with the central axis of the phosphor element 100. Furthermore, the bottom edge of the optical element 300 is arranged in the same plane as the surface 110 of the phosphor element. The optical element 300 comprises an first inner portion 302 and a second outer portion 304. Light emitted at small angles, i.e. small t, is collimated into a resulting light-beam emitted from the essentially flat light emission surface 310 of the optical element by the lens-formed inner portion 302 in the middle of the optical element 300. Light emitted at large angles is received by the side surface 306 of the outer portion 304, after which it is reflected at the curved surface 308 and redirected towards the light emission surface 310 of the optical element 300. The curved surface 308 does not have to be coated by a mirror material in order to reflect light as light will be incident at an angle large enough so that it will be reflected by total internal reflection.

The optical element 300 is designed so that the angle between the optical axis 301 and a light-ray hitting the transition point between the inner portion 302 and the outer portion 304 is equal to the angle $t_A$. By dividing the optical surface of the collimator into two segments at a point given by the angle $t_A$, it is possible to design the curved surface 303 of the lens portion 302 and the reflecting surface 308 in such a way that for every angle of emission from the light emission surface 310, the color point is equal. Thereby, the CoA-variation may be reduced or eliminated so that a homogeneous light-output may be provided in the far field.

The mathematical theory describing the design of the curved surfaces of the optical element is based on the work by M. Maes [Mathematical Method for Reflector design, M. Maes, PhD thesis 1997, ISBN 90-74445-36-5]. From the above referenced work, it can be shown that the curved surface shapes can be computed by solving the two coupled differential equations:

$$\sum_{i=1}^{N} d_i \frac{d\eta_i}{d\theta} I(\eta_i) = \varsigma(\theta),$$

$$\sum_{i=1}^{N} d_i \frac{d\eta_i}{d\theta} I(\eta_i) x(\eta_i) = x_{av} \varsigma(\theta).$$

Where N is the number of segments, I is the intensity distribution of the light source, $\varsigma$ is the target intensity distribution of the collimated beam, x is the x CIE color point coordinate and d is 1 for divergent and −1 for convergent beams. The function η describes the relation between the source emission angle t and the angle θ in the collimated beam. This function is obtained by solving the coupled differential equations. With this function, the shape of the optical element may for example be calculated. A further exemplary description of the mathematical derivation leading to the above equations is provided in "An inverse method for the design of TIR collimators to achieve a uniform color light beam" by C. R. Prins et al. which is to be submitted for publication and hereby fully incorporated by reference, and which is adhered at the end of this application of which it makes part.

A general explanation is that the optical element is configured so that each angle between 0° and $t_A$ is coupled to a predetermined emission angle from the optical element, and for each angle between 0° and $t_A$ there is a corresponding angle between $t_A$ and 90° coupled to the same predetermined emission angle from the optical element such that for all emission angles the color point of the emitted light is the same. As the flux of light emitted from the phosphor element is different for different emission angles t, the flux distribution is taken into account when determining the design of the curved surfaces of the optical element 300. The amount of flux in each light-ray direction from the optical element 300 is controlled by the local surface curvature where the rays hit the lens and reflector. Accordingly, it is possible to achieve different flux distributions. A desirable distribution may for example be a Gaussian beam with a 35° FWHM (Full Width Half Maximum) angle. An optical element providing a Gaussian, or bell-shaped, intensity distribution is readily achievable based on the aforementioned mathematical methods.

Figure 4:
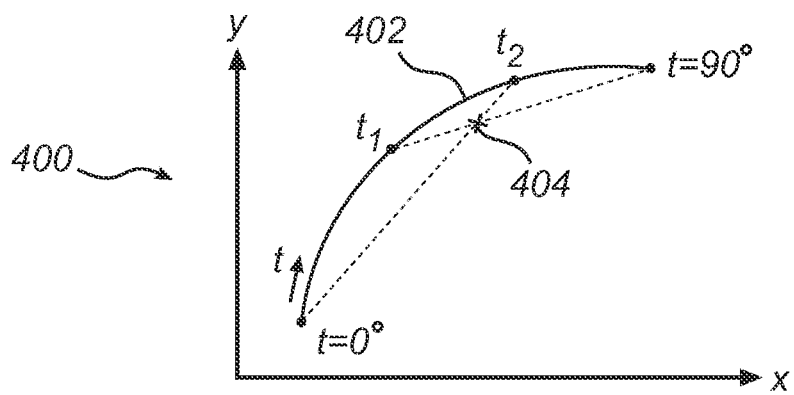
FIG. 4 is a graph schematically illustrating another example color vs. angle relation.

FIG. 4 illustrates an x,y color point as a function of the emission angle t for an LED and phosphor element combination where the CoA variation is not a linear function in x-y space. In FIG. 4, the CoA variation is described by a parabolic curve 402, which may be mathematically represented by a second degree polynomial. A non-linear CoA variation can occur for LED's in combination with a complex phosphor system. For example in a phosphor system containing more than one phosphor layer or a phosphor element comprising scattering particles which scatter light in preferred directions (photonic effects).

Figure 5:
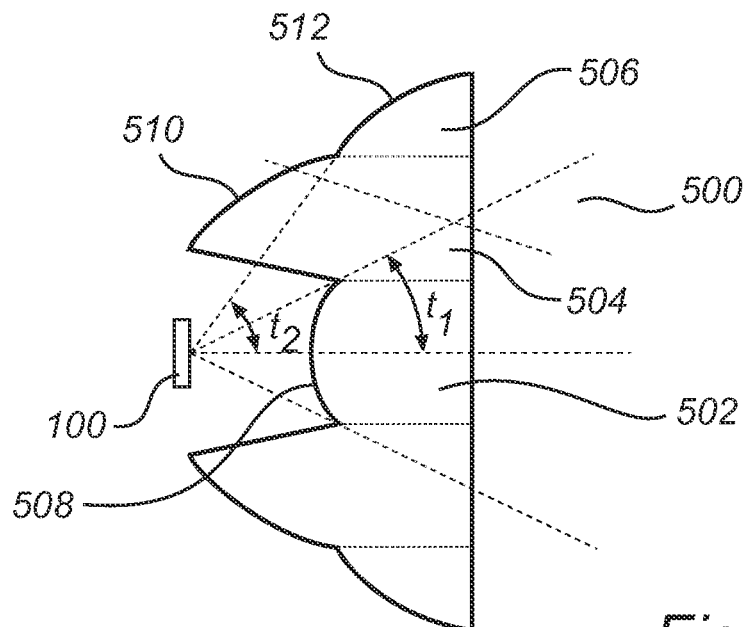
FIG. 5 is a schematic illustration of an optical element according to another embodiment of the invention.

In order to achieve a homogeneous light-output for a CoA variation according to FIG. 4, an optical element 500 comprising three portions, 502, 504 and 506, as illustrated in FIG. 5 must be used. The angle $t_1$ determining the intersection between the first 502 and second 504 portion, and the angle $t_2$ determining intersection between the second 504 and third 506 portion can be found from FIG. 4. The average color point of the LED is the point represented by a cross 404 in the graph 400. A straight line is drawn from t=90°, through the average color point 404 and on to intersect the CoA variation curve 402, thereby finding the first segment angle $t_1$ at the intersection. In a similar procedure, drawing a straight line from t=0°, through $t_A$ and to the curve 402 provides the second angle $t_2$. Accordingly, the optical element 500 is divided into three portions according to $t_1$ and $t_2$ as illustrated in FIG. 5. The principle of operation is the same as for the optical element 300 having two portions, with the exception that three coupled differential equations must be solved to calculate the curvature of the curved surfaces 508, 510 and 512. However, the same mathematical theory can be used. It should be noted that the exact shape of the curvature of the portions also depends on a choice made by the designer whether the emitted light-beam is to be convergent or divergent.

In principle, an optical element for a CoA variation described by a higher order polynomial may be designed in a similar manner as described above based on the fundamental mathematical description.

Even though the invention has been described with reference to specific embodiments thereof, many different alterations, modifications and the like will become apparent for those skilled in the art. For example, as the CoA variation of a light source can be measured, it is not necessary to theoretically describe the wavelength and flux distribution of a light source. Thereby, an optical element according to the present invention may be used together with essentially any light-source having an CoA variation.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A circular symmetric optical element for redirecting light, the light being emitted by a light source through a wavelength converting element, wherein the light emitted from the wavelength converting element has an average color $c_A$ and a wavelength distribution which depends on an emission angle from the wavelength converting element, wherein light having the average color $c_A$ has an emission angle $t_A$, the optical element comprising:
   a first optical portion configured to receive and redirect light having emission angles from said wavelength converting element lower than the emission angle $t_A$; and
   a second optical portion configured to receive and redirect light having emission angles from said wavelength converting element higher than the emission angle $t_A$, wherein said second optical portion has a first surface for receiving and refracting light emitted from the wavelength converting element and a second curved surface for receiving and reflecting said light refracted at the first surface towards a light-output surface of the optical element, wherein said second curved surface of said second optical portion is divided into two segments having different curved surfaces;
   wherein the first and second optical portions are individually configured such that for light of each selected out-coupling angle of the optical element, there is light received and redirected by the first optical portion to the selected out-coupling angle of the optical element, and corresponding light received and redirected by the second optical portion to the selected out-coupling angle from said optical element such that the total light beam emitted from said optical element as seen in the far field have a homogeneous color.

2. Optical element according to claim 1, wherein said homogeneous color corresponds to the average color $c_A$.

3. Optical element according to claim 1, wherein the intersection between the first and second portion is determined by $t_A$.

4. Optical element according to claim 1, wherein said first optical portion has a curved surface for receiving and refracting light emitted from the wavelength converting element towards a light-output surface of the optical element.

5. Optical element according to claim 1, wherein said first optical portion is a plano-convex lens.

6. Optical element according to claim 1, wherein said first surface is a flat surface.

7. Optical element according to claim 1, wherein said first surface is a curved surface.

8. Optical element according to claim 1, wherein the light emitted from the optical element has a Gaussian intensity profile.

9. A luminaire comprising:
   a light source;
   a wavelength converting element arranged so that light emitted by the light source pass through the wavelength converting element; and
   the optical element according to claim 1 arranged to receive light emitted by the wavelength converting element.

10. A luminaire according to claim 9, wherein the light source is a light emitting diode.

11. A luminaire according to claim 9, wherein the wavelength converting element is a phosphor element.

* * * * *